United States Patent
Daniel et al.

(10) Patent No.: US 9,202,683 B2
(45) Date of Patent: Dec. 1, 2015

(54) PRINTED MATERIAL CONSTRAINED BY WELL STRUCTURES AND DEVICES INCLUDING SAME

(71) Applicant: Palo Alto Research Center Incorporated, Palo Alto, CA (US)

(72) Inventors: Jurgen H. Daniel, San Francisco, CA (US); Ana Claudia Arias, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/094,670

(22) Filed: Dec. 2, 2013

(65) Prior Publication Data

US 2014/0087528 A1     Mar. 27, 2014

Related U.S. Application Data

(62) Division of application No. 13/473,463, filed on May 16, 2012, now Pat. No. 8,624,304.

(51) Int. Cl.
*H01L 21/02* (2006.01)
*H01L 21/368* (2006.01)
(Continued)

(52) U.S. Cl.
CPC .... *H01L 21/02288* (2013.01); *H01L 21/02488* (2013.01); *H01L 21/02628* (2013.01);
(Continued)

(58) Field of Classification Search
CPC ........................ H01L 51/0004–51/0007; H01L 51/0508–51/0545; H01L 21/02288; H01L 21/368; H01L 21/02628; H01L 27/1292

USPC ................... 257/E21.023, E21.038, E21.235, 257/E21.24, E21.487, E51.005; 438/30, 438/149, 151, 154, 159, 161, 164, 180, 197, 438/299, 585–587, 597, 677, 778, 942, 945, 438/947–949, FOR. 318, FOR. 473
See application file for complete search history.

(56) References Cited

U.S. PATENT DOCUMENTS 5,596,208 A    1/1997    Dodabalapur et al.
5,666,140 A    9/1997    Mitani et al.
(Continued)

FOREIGN PATENT DOCUMENTS

WO    WO2009/077738    * 12/2008    ............ 257/40

OTHER PUBLICATIONS

H. Sirringhaus, et al., "High-resolution Inkjet Printing of all-polymer transistor circuits", Science vol. 290, 2123 (2000).
(Continued)

*Primary Examiner* — Laura Menz
*Assistant Examiner* — Maliheh Malek
(74) *Attorney, Agent, or Firm* — Hollingsworth Davis, LLC

(57) ABSTRACT

A first patterned contact layer, for example a gate electrode, is formed over an insulative substrate. Insulating and functional layers are formed at least over the first patterned contact layer. A second patterned contact layer, for example source/drain electrodes, is formed over the functional layer. Insulative material is then selectively deposited over at least a portion of the second patterned contact layer to form first and second wall structures such that at least a portion of the second patterned contact layer is exposed, the first and second wall structures defining a well therebetween. Electrically conductive or semiconductive material is deposited within the well, for example by jet-printing, such that the first and second wall structures confine the conductive or semiconductive material and prevent spreading and electrical shorting to adjacent devices. The conductive or semiconductive material is in electrical contact with the exposed portion of the second patterned contact layer to form, e.g., an operative transistor.

13 Claims, 6 Drawing Sheets

(51) Int. Cl.
*H01L 29/786* (2006.01)
*H01L 51/00* (2006.01)
*H01L 29/66* (2006.01)
*H01L 21/77* (2006.01)
*H01L 27/12* (2006.01)

(52) U.S. Cl.
CPC ........ *H01L21/368* (2013.01); *H01L 29/66742* (2013.01); *H01L 29/66772* (2013.01); *H01L 29/7869* (2013.01); *H01L 29/78684* (2013.01); *H01L 51/0004* (2013.01); *H01L 27/1292* (2013.01)

(56) References Cited

U.S. PATENT DOCUMENTS

| | | | |
|---|---|---|---|
| 6,087,205 | A | 7/2000 | Yamamori |
| 6,525,865 | B2 | 2/2003 | Katase |
| 6,600,524 | B1 | 7/2003 | Ando et al. |
| 6,953,754 | B2 | 10/2005 | Machida |
| 7,132,788 | B2 | 11/2006 | Gupta et al. |
| 7,214,959 | B2 | 5/2007 | Seki et al. |
| 7,217,334 | B2 | 5/2007 | Toyoda |
| 7,247,339 | B2 | 7/2007 | Newsome et al. |
| 7,274,039 | B2 | 9/2007 | Park |
| 7,344,928 | B2 | 3/2008 | Wong et al. |
| 7,384,568 | B2 | 6/2008 | Wong et al. |
| 7,576,000 | B2 | 8/2009 | Daniel et al. |
| 7,696,096 | B2 | 4/2010 | Limb |
| 7,781,763 | B2 | 8/2010 | Hahn et al. |
| 7,858,969 | B2 | 12/2010 | Tsai et al. |
| 7,910,469 | B2 | 3/2011 | Hirai |
| 7,932,471 | B2 | 4/2011 | Seki et al. |
| 7,943,985 | B2 | 5/2011 | Kim et al. |
| 7,968,383 | B2 | 6/2011 | Honda et al. |
| 7,982,216 | B2 | 7/2011 | Imai |
| 7,994,579 | B2 | 8/2011 | Itai |
| 8,575,591 | B2 * | 11/2013 | Korpi et al. .......... 257/9 |
| 8,748,242 | B2 * | 6/2014 | Daniel et al. .......... 438/161 |
| 2004/0248338 | A1 * | 12/2004 | Sirringhaus et al. ...... 438/99 |
| 2005/0026317 | A1 * | 2/2005 | Sirringhaus et al. ...... 438/21 |
| 2005/0061780 | A1 | 3/2005 | Wakabayashi |
| 2005/0079338 | A1 | 4/2005 | Toyoda |
| 2005/0156176 | A1 | 7/2005 | Gupta et al. |
| 2005/0170076 | A1 | 8/2005 | Seki et al. |
| 2005/0170550 | A1 | 8/2005 | Seki et al. |
| 2005/0242342 | A1 | 11/2005 | Suh et al. |
| 2005/0247928 | A1 * | 11/2005 | Unno ........................ 257/40 |
| 2005/0269570 | A1 | 12/2005 | Chabinyc et al. |
| 2006/0027804 | A1 | 2/2006 | Yamazaki et al. |
| 2006/0128076 | A1 | 6/2006 | Li et al. |
| 2006/0154406 | A1 * | 7/2006 | Tanaka et al. ........... 438/142 |
| 2006/0160276 | A1 | 7/2006 | Brown et al. |
| 2006/0214312 | A1 | 9/2006 | Wu et al. |
| 2007/0012950 | A1 | 1/2007 | Cain et al. |
| 2007/0018152 | A1 | 1/2007 | Seki et al. |
| 2007/0020899 | A1 | 1/2007 | Hirai et al. |
| 2007/0026585 | A1 | 2/2007 | Wong et al. |
| 2007/0040165 | A1 * | 2/2007 | Dimmler et al. ............ 257/40 |
| 2007/0052766 | A1 | 3/2007 | Trauernicht et al. |
| 2007/0134832 | A1 * | 6/2007 | Oh et al. .................. 438/30 |
| 2007/0166855 | A1 | 7/2007 | Lee et al. |
| 2007/0172969 | A1 * | 7/2007 | Wong et al. ............... 438/22 |
| 2007/0221611 | A1 * | 9/2007 | Chow et al. ............... 216/13 |
| 2007/0243658 | A1 * | 10/2007 | Hirai et al. .............. 438/99 |
| 2007/0259476 | A1 | 11/2007 | Koo et al. |
| 2007/0267628 | A1 | 11/2007 | Koo et al. |
| 2007/0276091 | A1 | 11/2007 | Son et al. |
| 2007/0287270 | A1 | 12/2007 | Li et al. |
| 2008/0023695 | A1 | 1/2008 | Cho et al. |
| 2008/0023703 | A1 | 1/2008 | Hoffman et al. |
| 2008/0078990 | A1 | 4/2008 | Hahn et al. |
| 2008/0121884 | A1 | 5/2008 | Wong et al. |
| 2008/0153242 | A1 | 6/2008 | Daniel et al. |
| 2008/0157064 | A1 * | 7/2008 | Tsai et al. ............... 257/40 |
| 2008/0230774 | A1 * | 9/2008 | Hirai ..................... 257/40 |
| 2008/0242083 | A1 | 10/2008 | Yoshizumi |
| 2008/0296560 | A1 | 12/2008 | Hirakata et al. |
| 2008/0311698 | A1 | 12/2008 | Mohapatra et al. |
| 2009/0020751 | A1 | 1/2009 | Seki et al. |
| 2009/0045396 | A1 | 2/2009 | Hahn et al. |
| 2009/0098704 | A1 | 4/2009 | Ohnuma et al. |
| 2009/0145641 | A1 | 6/2009 | Daniel et al. |
| 2009/0148971 | A1 | 6/2009 | Fujii et al. |
| 2009/0153942 | A1 | 6/2009 | Daniel et al. |
| 2009/0159880 | A1 | 6/2009 | Honda et al. |
| 2009/0159891 | A1 | 6/2009 | Daniel et al. |
| 2009/0224239 | A1 | 9/2009 | Wakita |
| 2009/0275192 | A1 | 11/2009 | Daniel et al. |
| 2009/0302321 | A1 | 12/2009 | Park et al. |
| 2009/0302333 | A1 | 12/2009 | Seki et al. |
| 2009/0315023 | A1 | 12/2009 | Wallace et al. |
| 2009/0321725 | A1 | 12/2009 | Yoshida et al. |
| 2010/0019319 | A1 | 1/2010 | Hirai |
| 2010/0051712 | A1 | 3/2010 | Gregory |
| 2010/0051922 | A1 * | 3/2010 | Hotta et al. ............ 257/40 |
| 2010/0059746 | A1 | 3/2010 | Itai |
| 2010/0078639 | A1 | 4/2010 | Nomoto et al. |
| 2010/0096621 | A1 | 4/2010 | Chuman |
| 2010/0108999 | A1 | 5/2010 | Mueller et al. |
| 2010/0127268 | A1 | 5/2010 | Daniel et al. |
| 2010/0127269 | A1 | 5/2010 | Daniel et al. |
| 2010/0213449 | A1 | 8/2010 | Yamamoto et al. |
| 2010/0252857 | A1 | 10/2010 | Nakatani et al. |
| 2010/0252927 | A1 | 10/2010 | Wong et al. |
| 2010/0304528 | A1 | 12/2010 | Kim et al. |
| 2011/0003418 | A1 | 1/2011 | Sakata et al. |
| 2011/0042656 | A1 * | 2/2011 | Burroughes et al. ........... 257/40 |
| 2011/0042674 | A1 | 2/2011 | Saito et al. |
| 2011/0042691 | A1 | 2/2011 | Hayata et al. |
| 2011/0068332 | A1 | 3/2011 | Han et al. |
| 2011/0147742 | A1 | 6/2011 | Sambandan et al. |
| 2011/0180907 | A1 | 7/2011 | McConnell |
| 2011/0187267 | A1 | 8/2011 | Yamamoto et al. |
| 2012/0181512 | A1 * | 7/2012 | Puntambekar et al. ......... 257/40 |

OTHER PUBLICATIONS

Y. Xia, et al., "Nonlithographic patterning through inkjet printing via holes", Appl. Phys Lett. 90, 253513 (2007).
File History for U.S. Appl. No. 13/473,393.
File History for U.S. Appl. No. 14/094,677.
U.S. File History for U.S. Appl. No. 14/094,677.

* cited by examiner

PRINTED MATERIAL CONSTRAINED BY WELL STRUCTURES AND DEVICES INCLUDING SAME

CROSS-REFERENCE TO RELATED APPLICATIONS

The present application is a divisional of copending U.S. Application for Letters patent Ser. No. 13/473,463, filed on May 16, 2012, which is incorporated by reference herein and to which priority is hereby claimed, and which is itself a divisional of U.S. Pat. No. 8,211,782, which is incorporated by reference herein (and to which priority is hereby claimed through the priority of application Ser. No. 13/473,463).

STATEMENT REGARDING FEDERALLY SPONSORED RESEARCH AND DEVELOPMENT

The U.S. Government has a fully paid-up license in this disclosure and the right in limited circumstances to require the patent owner to license others on reasonable terms as provided for by the terms of contract number W81XWH-08-C-0065 DARPA-SENSOR TAPE, awarded by the Defense Advanced Research Projects Agency (DARPA).

BACKGROUND

1. Field of the Invention

This invention relates generally to electronic device fabrication, and more particularly to a method employing a printed mask to form active device elements by a printing process such that the printed mask controls dimensions of the active device elements.

2. Description of the Prior Art

Digital lithography is a maturing technology designed to reduce the costs associated with photolithographic processes, used often in the fabrication of micro-electronic devices, integrated circuits, and related structures. Digital lithography directly deposits patterned material onto a substrate in place of the delicate and time-consuming photolithography processes used in conventional manufacturing processes. The printed pattern produced by digital lithography can either comprise actual device features (i.e., elements that will be incorporated into the final device or circuitry, such as the source, drain, and gate regions of thin film transistors, signal lines, opto-electronic device components, etc.) or it can be a mask for subsequent semiconductor processing (e.g., etch, implant, etc.) Importantly, unlike traditional lithographic systems, digital lithography systems avoid the cost and challenges associates with the use of reticles or masks.

Typically, digital lithography involves depositing a print material by moving a printhead and a substrate relative to one another along a single axis (the print travel axis). Print heads, and in particular, the arrangements of the ejectors incorporated in those print heads, are optimized for printing along this print travel axis. Printing takes place in a raster fashion, with the print head making printing passes across the substrate as the ejector(s) in the print head dispense individual droplets of print material onto the substrate. At the end of each printing pass, the print head (or substrate) makes a perpendicular shift relative to the print travel axis before beginning a new printing pass. Printing passes continue in this manner until the desired pattern has been fully printed onto the substrate.

Materials typically printed by digital lithographic systems include phase change material and solutions of polymers, colloidal suspensions, such suspensions of materials with desired electronic properties in a solvent or carrier. For example, U.S. Pat. Nos. 6,742,884 and 6,872,320 (each incorporated herein by reference) teach a system and process, respectively, for printing a phase change material onto a substrate for masking. According to these references, a suitable material, such as a stearyl erucamide wax, is maintained in liquid phase over an ink-jet style piezoelectric printhead, and selectively ejected on a droplet-by-droplet basis such that droplets of the wax are deposited in desired locations in a desired pattern on a layer formed over a substrate. The droplets exit the printhead in liquid form, then solidify after impacting the layer, hence the material is referred to as phase-change.

Once dispensed from an ejector, a print material droplet attaches itself to the substrate through a wetting action, then proceeds to solidify in place. In the case of printing phase-change materials, solidification occurs when the heated and liquefied printed droplet loses its thermal energy to the substrate and/or environment and reverts to a solid form. In the case of suspensions or solutions, after wetting to the substrate, the carrier most often either evaporates leaving the suspended or dissolved material on the substrate surface or the carrier hardens or cures. The print material may also simply consist of a low-molecular weight monomer which cross-links and therefore solidifies upon irradiation with actinic radiation such as UV light. The thermal conditions and physical properties of the print material and substrate, along with the ambient conditions and nature of the print material, determine the specific rate at which the deposited print material transforms from a liquid to a solid, and hence the height and profile of the solidified deposited material.

If two adjacent droplets are applied to the substrate within a time prior to the solidification of either or both droplets, the droplets may wet and coalesce together to form a single, continuous printed feature. Surface tension of the droplet material, temperature of the droplet at ejection, ambient temperature, and substrate temperature are key attributes for controlling the extent of droplet coalescence and lateral spreading of the coalesced material on the substrate surface. These attributes may be selected such that a desired feature size may be obtained.

However, one disadvantage of digital lithography is that since the printed material is deposited in liquid form, it tends to spread after deposition and prior to solidification. When printing devices close together, for example less that 20-40 μm (micrometers) edge-to-edge, the droplet spreading can result in device-to-device short circuit (e.g., when forming electronic devices such as transistors), or device-to-device cross contamination (e.g., when forming an array of biological test units). While digital lithography has been used to isolate adjacent structures, such as wells for color filter material in a color filter for a flat panel display and the like, heretofore no device designs have successfully included printed well structures in forming active electronic devices, forming structures over active device layers, nor forming structures to confine the deposition of active device material.

SUMMARY

Accordingly, the present disclosure provides methods for manufacturing micro-electronic, opto-electronic, bio-electronic, or similar devices employing digital lithography, and the devices so manufactured, which have improved device-to-device isolation as compared to methods and devices previously produced by digital lithography.

According to one aspect of the disclosure, a method is provided for forming an active device, the method comprising selectively depositing insulating material over at least a portion of a substrate to form first and second wall structures, and selectively depositing an electrically active material between said first and second wall structures such that said first and second wall structures confine said active material to thereby form an active structure.

According to another aspect of the disclosure, a first patterned contact layer is formed over an insulative substrate. Insulative material is then selectively deposited over at least a portion of the first patterned contact layer to form first and second wall structures such that at least a portion of the patterned contact layer is exposed, the first and second wall structures defining a well region therebetween. An electrically active (or semiconductive) material is then selectively deposited within the well region such that the first and second wall structures confine the electrically active material therein, and the electrically active material is in physical and electrical contact with the exposed portion of the patterned contact layer.

According to a variation of these aspects, the electrically active material may be a semiconductor, and the device formed is a print patterned transistor. According to another variation of this aspect, the first and second wall structures define a sample-receiving well over a test circuit, and the device formed is a biological assaying array.

According to still further variations, a functional layer may be deposited over the substrate, either before or after forming the patterned contact layer, or a portion thereof. The functional layer may be a hydrophobic (or low-surface energy) coating such as silane, silazane, polysilsesquioxane, and fluorocarbon, or may be a hydrophilic (or high surface-energy) coating such as polyethylene glycol, polyethylene oxide, and proteins.

The wall structures are preferably formed by a digital lithographic process. Likewise, the electrically active material deposited within the well structures is deposited by a digital lithographic (or digital printing) process. Indeed, other or even all of the elements of the device being formed, such as the patterned contact layer, functional layer, etc. may also be deposited by a digital lithographic (or digital printing) process according to certain aspects and applications of the present disclosure. Some layers, such as the contact layers may also be formed by other processes such as offset-, gravure-, flexo- or screen printing, by conventional lithography and patterning or by deposition through a shadow mask.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that descriptions of well known starting materials, processing techniques, components, equipment and other well known details are merely summarized or are omitted so as not to unnecessarily obscure the details of the present invention. Thus, where details are otherwise well known, we leave it to the application of the present invention to suggest or dictate choices relating to those details.

Figure 1:
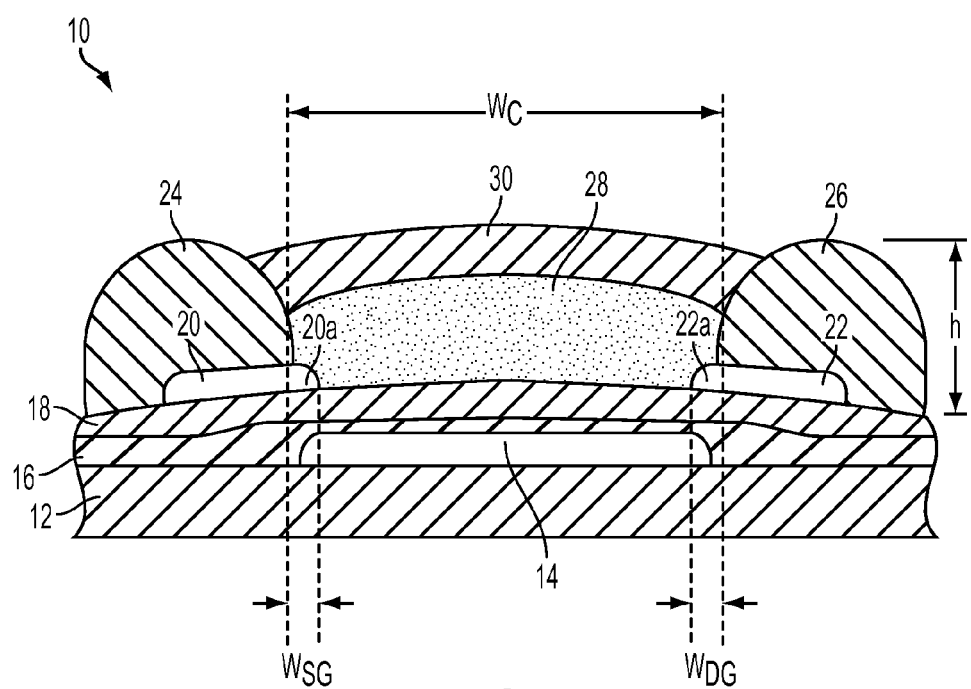
FIG. 1 is a cross-section view of a bottom-gate transistor device formed according to an embodiment disclosed herein.

According to a first embodiment of this disclosure, illustrated in FIG. 1, a bottom-gate transistor device is fabricated. The embodiment makes extensive use of digital lithography, digital printing or laser transfer processes. Spreading of materials deposited, for example by a digital lithography process, is reduced so that more compact devices are possible, smaller pitch arrays are possible, and device-to-device shorting is eliminated. The embodiments described herein related to the formation of active electronic devices, such as electronic switching elements, as opposed to passive elements, such as electrical filters and the like.

With reference to FIG. 1, the formation of a device 10 begins with preparation of a suitable substrate 12. Many different types of substrates may be employed, since growth is not epitaxial from the substrate. Examples of substrate materials include ceramics, polymers, crystalline materials, metals, etc., and may be rigid or flexible. In the case of conductive substrates, an insulting layer (not shown) is first deposited.

In the case of a bottom-gate transistor device, a gate electrode 14 is formed by depositing one or more droplets of conductive material. In the present embodiment, gate electrode 14 will preferably be formed by jet-printing of conductive ink, such as a solution of silver nanoparticles or silver precursor ink (these inks form an electrically conductive layer after a thermal annealing step). Although the main focus of this disclosure is on printing methods, gate electrode 14 may be deposited and patterned by more conventional methods such as sputtering or evaporation followed by photolithography and etching techniques such as wet chemical etching. Gate electrode 14 may also be patterned using laser ablation or laser deposition. Moreover, gate electrode 14 may be patterned by shadow mask evaporation or other method known in the art.

An insulating layer 16 forming a gate dielectric layer may be deposited by jet-printing, doctor-blading, spin-coating, slot-coating, Langmuir-Blodgett, spray coating or other common deposition method. Insulating layer 16 is typically thin in order to obtain a high specific capacitance. The layer may be as thin as a few nanometers (nm) up to several micrometers (µm) and typically several hundred nm. Insulating layer 16 may comprise materials such as self assembled monolayers, polymer dielectrics or composite or multilayer dielectrics. Examples of materials are polyvinylphenol (PVP), polyvinylcinnamate, polystyrene, polymethylmethacrylate (PMMA), polyvinyl alcohol (PVA), fluorinated polymers such as CYTOP (from Asahi Glass), epoxy-based polymers such as SU-8 (MicroChem, Corp.), polysilsesquioxanes, polyimide, composites of polymer with titania nanoparticles, etc. Insulating layer 16 may also be deposited by non-solution processes, such as thermal evaporation, atomic layer deposition (ALD), chemical vapor deposition (CVD), lamination, etc. In one example, the gate dielectric comprises ALD deposited aluminum oxide or hafnium oxide. In another example it comprises evaporated Parylene. Insulating layer 16 may also be grown directly on gate electrode 14 by oxidation or by anodization methods.

A functional layer 18 is next deposited over insulating layer 16. Functional layer 18 may be a hydrophobic (or low-surface-energy) material such as a nonpolar polymer, a hydrophobic silane, silazane, polysilsesquioxane, fluorocarbon, etc. Materials such as Methyl-silanes, linear or branched alkyl-silanes, aromatic silanes, fluorinated alkyl silanes or dialkyl silanes are also examples. Alternatively, functional layer 18 may be a hydrophilic (or high surface-energy) layer such as polar polymer, polyethylene glycol (PEG), polyethylene oxide, a protein such as bovine serum albumin (BSA), etc. Aminoalkyl silsesquioxanes, aminosilanes, epoxy functional silanes, polar hydrophilic silanes, hydroxylic hydrophilic or ionic hydrophilic silanes are also examples of hydrophilic functional layers. Use of a phase change material for printing the features of device 10 disclosed herein has the advantage that the deposition process is generally insensitive to the surface energy of the substrate. It is therefore possible to print features over a very hydrophobic or very hydrophilic functional layer 18. Moreover, a phase-change ink does not contain substantial amounts of solvents which otherwise could negatively affect the functional layer.

Functional layers are often required in the gate region of thin-film transistors such as organic thin-film transistors. It has been shown that certain hydrophobic coatings on the gate dielectric improve the molecular ordering of polymeric semiconductors such as polythiophenes. For example, a self-assembled monolayer of OTS (Octadecyltrichlorosilane), a silane which has a long hydrophobic tail, on a silicon dioxide gate dielectric significantly improves the device mobility in transistors with PQT-12 or P3HT (poly3-hexylthiophene) organic semiconductor. Similar improvements of the transistor device performance have been observed with other alkyl substituted silanes, phenylsilanes or HMDS (hexamethyldisilazane). The functional layer may also be a coating of a polysilsesquioxane such as a methylated polysilsesquioxane or other functional layer that interacts with the semiconductor in a way that improves the device performance.

The functional layer may also serve to modify the interface between the gate dielectric and the semiconductor. For example, a gate dielectric such as a layer of high-k tantalum oxide or aluminum oxide can exhibit charge traps at the interface with the semiconductor. This is undesirable since it reduces the transistor mobility and causes degraded device stability. A thin functional layer such as a polysilsesquioxane or a thin low-k coating (such as Cytop, an amorphous fluorocarbon polymer, Asahi Glass Co.) can improve the device performance by providing an interface with a lower charge-trap density.

In one specific example, a printed transistor is fabricated by solution depositing a 300-600 nm thick PVP (polyvinylphenol) gate dielectric over a silver gate electrode (printed from silver nanoparticle solution). A thin (~10-50 nm) layer of polymethylsilsesquioxane is then deposited onto the PVP gate dielectric. Silver source drain electrodes are then jet-printed. This process may require treatment of the hydrophobic silsesquioxane layer with an oxygen plasma before printing. The polythiophene semiconductor PQT-12 is then deposited from a solution onto the gate dielectric, forming a connection between source and drain electrodes.

In summary, the functional layer in a printed transistor can have a range of purposes, including modification of interface states of the gate dielectric, influence of the molecular ordering of the deposited organic semiconductor or control of the film formation of the drying semiconductor. In some cases, the surface has to be turned more hydrophilic (the surface energy has to be increased). For example, if the surface is very hydrophobic, film formation of the semiconductor may not take place because excessive dewetting occurs. In this case, a functional layer such as an aminosilane may be applied to increase the surface energy. Other materials to increase the surface energy include PVA (polyvinylalcohol), polyethylene oxide, polyethyleneglycol, etc. A more hydrophilic surface may improve the film formation of the semiconductor, but it may also lead to excessive spreading of the printed drops. Therefore a well structure is particularly essential.

Source electrode 20 and drain electrode 22 are next formed over functional layer 18. As with gate electrode 14, source and drain electrodes 20, 22 will preferably be formed by jet-printing for example a conductive ink. Source and drain electrodes 20, 22 may also be deposited and patterned by more conventional methods such as sputtering or evaporation followed by photolithography and etching techniques such as wet chemical etching. Source and drain electrodes 20, 22 may also be patterned using laser ablation or laser deposition, by shadow mask evaporation, or by another method known in the art.

First wall structure 24 and second wall structure 26 are then deposited such that they do substantially but do not completely cover source electrode 20 and drain electrode 22, respectively. First and second wall structures 24, 26 are substantially taller than source and drain electrodes 20, 22, and may be, for example, on the order of height h=0.5-5.0 microns above the surface of functional layer 18. First and second wall structures 24, 26 define a well or channel substantially over gate electrode 14. The width, $W_C$, of the well or channel may be, for example, on the order of 10-500 microns. First and second wall structures 24, 26 may be formed of a phase change material, which advantageously allows both obtaining the desired height and the ability to print directly upon a hydrophobic or hydrophilic functional layer 18.

As mentioned, first wall structure 24 is deposited such that a region 20*a* of source electrode 20 is left uncovered thereby. This exposed region 20*a* may have a width, $W_{SG}$ on the order of 5-50 microns, but can be as small as 0.5 microns or less, as long as sufficient surface protrudes to allow the formation of an electrical contact to the semiconductor material. Likewise, second wall structure 26 is deposited such that a region 22*a* of drain electrode 22 is left uncovered thereby. This exposed region 22*a* may have a similar width, $W_{DG}$ as discussed with regard to $W_{SG}$. These exposed regions 20*a*, 22*a* become the ohmic contact for subsequently deposited semiconducting channel material.

First and second wall structures 24, 26 can take a variety of forms. In a preferred embodiment, first and second wall structures 24, 26 may be an insulating phase-change material that is deposited in a melted state and which then solidifies after being deposited. A wax such as a stearyl stearamide (Kemamade) is an example. Another example is a radiation curable gel ink such as disclosed in U.S. Patent Publication No. 2007/0120924, which is hereby incorporated herein by this reference in its entirety. Some radiation curable materials such as UV curable polymers that do not substantially rely on solvent evaporation are also included in the class of phase-change polymer since they are transferred from a liquid state into a solid state upon UV exposure. In at least one form, the positioning of the printed polymer is very accurate and depends on the printhead.

A semiconductor layer 28 is next deposited in the well region between first and second wall structures 24, 26. In one embodiment, the material comprising semiconductor layer 28 is a jet-printed polymer semiconductor solution. In another embodiment, semiconductor layer 28 is a precursor (including pentacene, zinc oxide or silicon precursors, as well as carbon nanotubes, silicon nanowires or nano-belts, graphene, silicon nano particles or other semiconducting nanoparticles, nano-rods, nano-ribbons, etc.) For example, the semiconductor may consist of a layer of jet-printed P3HT or PQT-12 polythiophene semiconductor. The semiconductor may also be jet-printed small-molecule precursors such as TIPS (bis (triisopropylsilylethynyl))-pentacene or N-sulfinylcarbamate-pentacene. Importantly, with wall structures 24, 26 formed sufficiently high, they serve to limit any spreading of the material forming semiconductor layer 28, and prevent device-to-device short circuiting. Furthermore, with regions 20a, 22a of source and drain electrodes 20, 22 exposed, semiconductor layer 28 may make electrical contact with those portions, and thereby form a channel region for a transistor device.

Following deposition of semiconductor layer 28, a passivation layer 30 is formed thereover. Passivation layer 30 may comprise materials such as polymer dielectrics deposited by jet printing. Alternatively, passivation layer 30 may be deposited by other methods such as slot-coating, spray coating, dip-coating and not only confined to the well region. Examples of materials are PMMA, polystyrene, polyvinylalcohol (PVA), fluorinated polymers such as CYTOP (from Asahi Glass), If wall structures 24, 26 have a sufficient height, h, they may confine passivation layer 30 to the well region. A discrete semiconductor device is thereby formed. The passivation may also be formed by a phase separation process in which the semiconductor and insulator are deposited as a blend into the well and the phase separation occurs during the drying process with the insulating layer remaining at the top and forming the passivation. However, the passivation layer may also be uniformly coated over the surface, such as by evaporation of a layer of Parylene.

Figure 2A:
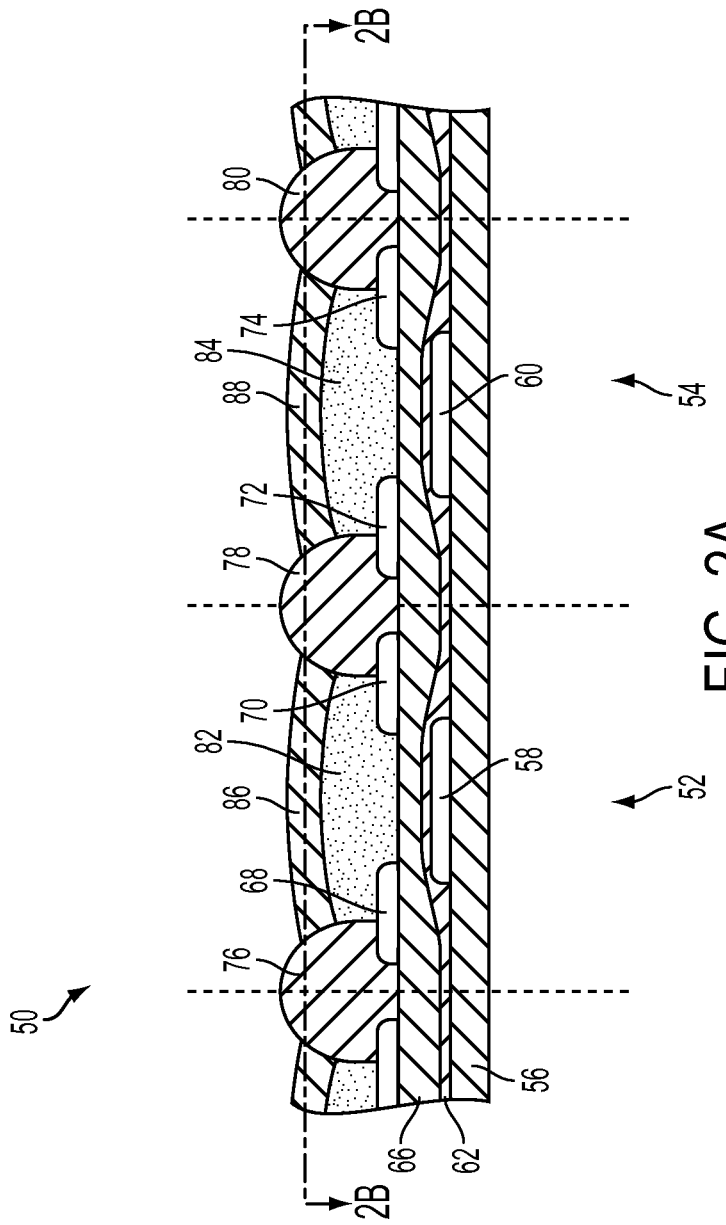
FIG. 2A is a cross-section of two bottom-gate transistor devices sharing a common wall structure formed according to an embodiment disclosed herein.
Figure 2B:
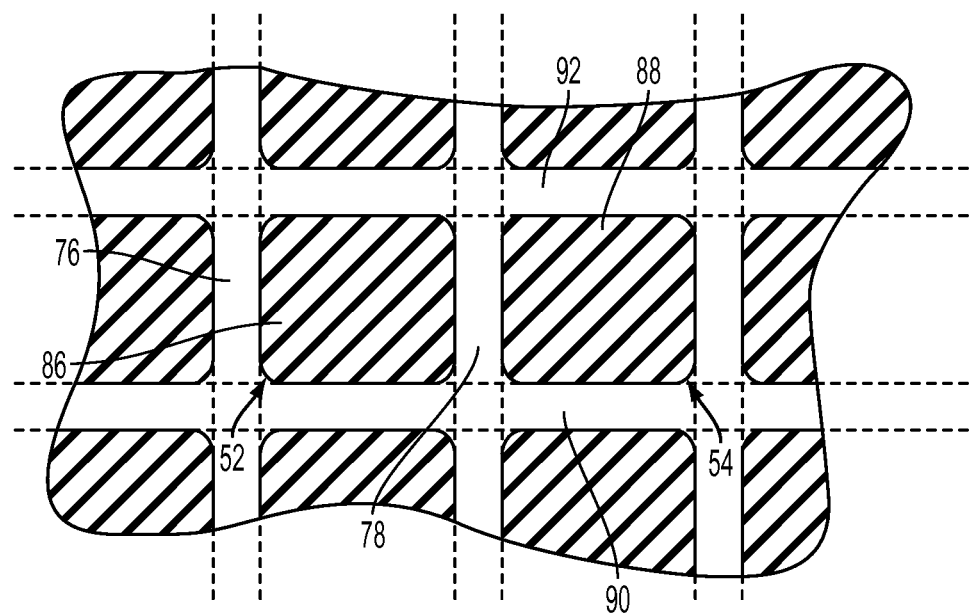
FIG. 2 B is a plan (top) view of the two bottom-gate transistor devices illustrated in FIG. 2A.

According to the method disclosed above, wall structures effectively limit spreading of jet printed semiconducting or conducting material, eliminating device-to-device short circuiting. Thus, closely packed arrays of devices may be fabricated. Indeed, it is possible to form devices which share wall structures, such as illustrated in FIG. 2A (cut-away side view) and FIG. 2B (plan view) which shows a two-device structure 50. It will be appreciated that arrays comprising many more than two devices may similarly be formed. Device 50 comprises a substrate 56 having gate electrodes 58 and 60 formed thereon. As previously described, gate electrodes 58, 60 will preferably be formed by jet-printing.

Insulating layer 62 is next deposited by an appropriate method. Examples of materials are polyvinylphenol (PVP), polyvinylcinnamate, polystyrene, polyvinylalcohol (PVA), fluorinated polymers such as CYTOP (from Asahi Glass), epoxy-based polymers such as SU-8 (MicroChem, Corp.), polysilsesquioxanes, polyimide, PMMA, composites of polymer with titania nanoparticles, etc.

A functional layer 66 is next deposited over insulating layer 62. As previously described, functional layer 66 may be a hydrophobic material such as silane, silazane, polysilsesquioxane, fluorocarbon, etc. Alternatively, functional layer 66 may be a hydrophilic layer such as polyethylene glycol (PEG), polyethylene oxide, or an aminosilane, for example.

A plurality of source electrodes 68, 72 and drain electrodes 70, 74 are next formed over functional layer 66. Electrodes 68, 70, 72, 74 are preferably formed by jet-printing of a conducting material, e.g., from a silver nanoparticle solution.

Wall structures 76, 78, 80 are then deposited as previously described such that they substantially but do not completely cover electrodes 68, 70, 72, 74. Two well regions are thereby formed, one for each of transistors 52, 54, with wall structure 78 shared between the two. This arrangement of a shared wall structure provides reduced-device-to-device spacing, resulting in high device-count arrays.

A semiconductor layer 82 is next printed or deposited in the well region between wall structures 76, 78, and similarly a semiconductor layer 84 is next printed or deposited in the well region between wall structures 78, 80. Typically, semiconductor layers 82, 84 are the same material composition. However, semiconductor layer 82 may be comprised of a material which differs from the material comprising semiconductor layer 84, depending on the intended application of the device so formed. Particularly, semiconductor 82 may be an n-type semiconductor and semiconductor 84 may be a p-type semiconductor and the adjacent TFTs may be connected to form a simple inverter circuit.

Finally, a passivation layer 86 is formed over semiconductor layer 82, and a passivation layer 88 is formed over semiconductor layer 84. Typically, passivation layers 86, 88 are comprised of the same material. However, passivation layer 86 may be comprised of a different material than passivation layer 88 depending on the intended application of the device so formed. Furthermore, passivation layers 86, 88 may in fact be a single continuous layer deposited over the structure including the upper extents of wall structures 76, 78, 80 in appropriate embodiments.

Accordingly, two adjacent, electrically isolated transistor devices 52, 54 are thereby formed. Given proper array interconnections, these devices may thus operate in an array such as a display control, sensor control, logic array, etc.

Figure 3:
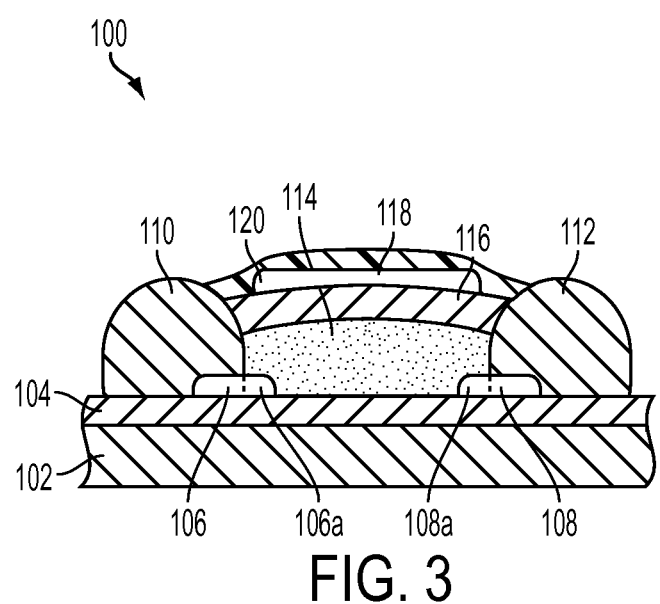
FIG. 3 is a cross-section view of a top-gate transistor device formed according to an embodiment disclosed herein.

According to another embodiment of the present disclosure, a top-gate transistor device 100 is formed. With reference to FIG. 3, the formation of a device 100 begins much as with the prior embodiments, with preparation of a suitable substrate 102. Examples of substrate materials include ceramics, polymers, crystalline materials, metals, etc., and may be rigid or flexible.

A functional layer 104 is next deposited over substrate 102. Functional layer 104 may be a hydrophobic (or low-surface-energy) material such as a nonpolar polymer, a hydrophobic silane, silazane, polysilsesquioxane, fluorocarbon, etc. Materials such as Methyl-silanes, linear or branched alkyl-silanes, aromatic silanes, fluorinated alkyl silanes or dialkyl silanes are also examples. Alternatively, functional layer 104 may be a hydrophilic (or high surface-energy) layer such as polar polymer, polyethylene glycol (PEG), polyethylene oxide, a protein such as bovine serum albumin (BSA), etc. Aminoalkyl silsesquioxanes, aminosilanes, epoxy functional silanes, polar hydrophilic silanes, hydroxylic hydrophilic or ionic hydrophilic silanes are also examples of hydrophilic functional layers.

Source electrode 106 and drain electrode 108 are next formed over functional layer 104. Each of electrodes 106, 108 are formed by depositing one or more droplets of conductive material, preferably by jet-printing. Although the main focus of this disclosure is on printing methods, electrodes 106, 108 may be deposited and patterned by more conventional methods such as sputtering or evaporation followed by photolithography and etching techniques such as wet chemical etching. Electrodes 106, 108 may also be patterned using laser ablation or laser deposition, by shadow mask evaporation or other method known in the art.

First wall structure 110 and second wall structure 112 are then deposited such that they substantially but do not completely cover source electrode 106 and drain electrode 108, respectively. In a preferred embodiment, first and second wall structures 110, 112 may be an insulating phase-change material that is deposited in a melted state and which then solidifies after being deposited. A wax such as a stearyl stearamide (Kemamade) is an example. The height of first and second wall structures 110, 112 are again on the order of h=0.5-10 microns above the surface of functional layer 104. First and second wall structures 110, 112 define a well which will receive a semiconductor material, and over which a gate electrode will be formed.

First wall structure 110 is deposited such that a region 106a of source electrode 106 is left uncovered thereby. Likewise, second wall structure 112 is deposited such that a region 108a of drain electrode 108 is left uncovered thereby. These exposed regions 106a, 108a become the electrical contacts for the subsequently deposited semiconducting channel material.

A semiconductor layer 114 is next printed or deposited in the well region between first and second wall structures 110, 112. In one embodiment, semiconductor layer 114 is a jet-printed polymer semiconductor solution. In another embodiment, semiconductor layer 28 is a precursor (including pentacene, zinc oxide or silicon precursors, as well as carbon nanotubes, silicon nanowires or nano-belts, grapheme, silicon nano-particles or other semiconducting nano-particles, nano-rods, nano-ribbons, etc.) Wall structures 110, 112 serve to limit any spreading of semiconductor layer 114, and thereby prevent device-to-device short circuiting. Semiconductor layer 114 makes ohmic contact with exposed regions 106a, 108a to thereby provide a channel region for a transistor device.

Following deposition of semiconductor layer 114, a first passivation layer 116 is formed thereover. This passivation layer serves as the gate dielectric layer. A gate electrode 118 may then be formed over passivation layer 116, aligned so as to be above the well formed between wall structures 110, 112. Gate electrode 118 is formed by depositing one or more droplets of conductive material, preferably by jet-printing. Gate electrode 118 may be entirely within the lateral width of the well formed between wall structures 110, 112 or it may extend further (as long as it does not cause any unintended shorting to neighboring devices). As an optional final step, a second passivation layer 120 is formed over the device including gate electrode 118 and possibly over the entire device including wall structures 110, 112, particularly if the gate dielectric is very thin. A functional top-gate semiconductor device is thereby provided.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Figure 4:
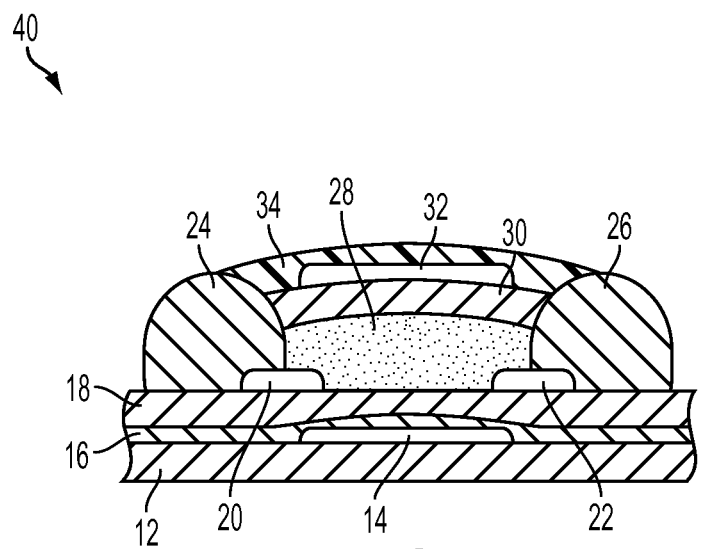
FIG. 4 is a cross-section view of a dual-gate (top-bottom) transistor device formed according to an embodiment disclosed herein.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. For example, separate top-gate and bottom-gate embodiments have been described above. However, it is within the scope of the present disclosure that a dual-gate (top and bottom) device can readily be obtained from the disclosure above. Such a device is illustrated in FIG. 4, with the top gate 32 and top-gate passivation 34 essentially being added to the device described with regard to FIG. 1.

Figure 5:
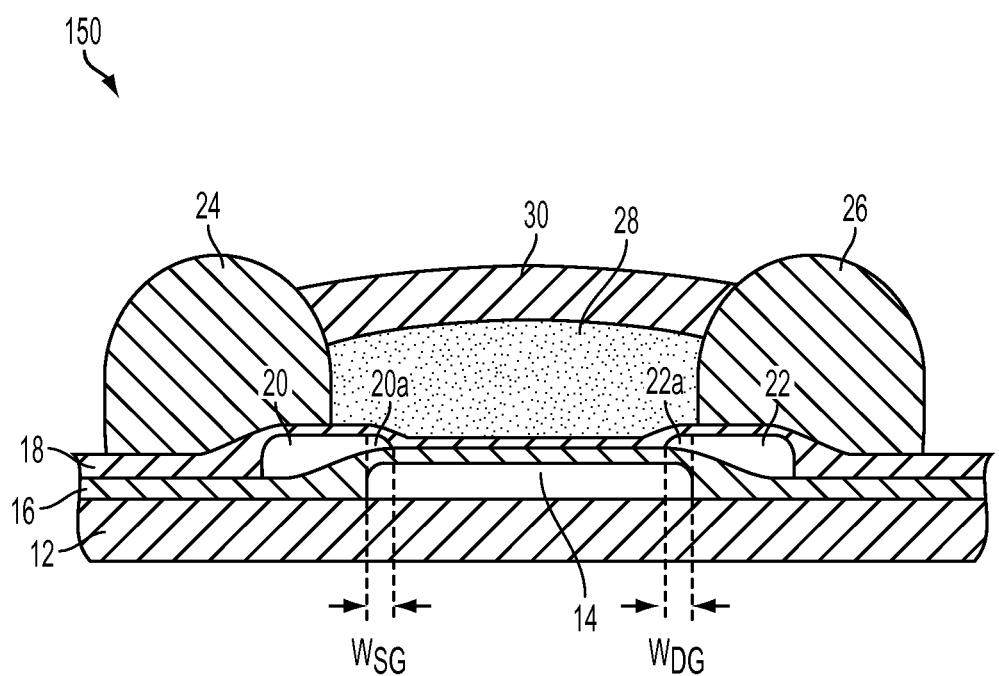
FIG. 5 is a cross-section view of a bottom-gate transistor device with a functional layer formed over the gate according to another embodiment disclosed herein.

Furthermore, the above disclosure has been based on forming a functional layer below source and drain electrodes. However, it is possible to first form the source and drain electrodes, then form the functional layer thereover. In this case, the functional layer has to be very thin to allow electron tunneling through the layer and/or to exhibit a sufficient population of pinholes for an electrical contact to form between source/drain electrodes and a semiconductor layer formed between the walls thereover. An embodiment 150 having the functional layer 18 formed over electrodes 20, 22 is illustrated in FIG. 5. Again, an overlap 20a, 22a is provided between a gate electrode 14 and a portion of source electrode 20a and drain electrode 22a. The method for forming such a device is substantially as described above, with the order of forming the source and drain electrodes and the functional layer simply reversed.

Furthermore, various presently unforeseen or unanticipated alternatives, modifications, variations, or improvements to or on the embodiments described above may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A method of forming a transistor device, comprising:
forming a gate electrode over a substrate;
forming a gate dielectric layer over at least said gate electrode;
depositing a functional layer over at least a portion of said substrate, said gate electrode, and said gate dielectric;
selectively depositing a patterned contact layer over said functional layer, said patterned contact layer defining first and second electrodes of said active device, wherein said first electrode is a source electrode, said second electrode is a drain electrode;
selectively additively depositing, by printing, insulating material over at least a portion of said patterned contact layer to form first and second wall structures such that at least a portion of said patterned contact layer over said first electrode and at least a portion of said patterned contact layer over said second electrode are exposed, said first and second wall structures defining a well region therebetween, and said exposed portions of said patterned contact layer over said first and second electrodes are within said well region; and selectively depositing a semiconductor layer from a solution within said well region such that said first and second wall structures confine said semiconductor layer therein, and said semiconductor layer within said well region is in physical and electrical contact with said exposed portion of said patterned contact layer over said first and second electrodes.

2. The method of claim 1, wherein the functional layer is a hydrophobic layer.

3. The method of claim 2, wherein the hydrophobic layer is selected from the group consisting of: hydrophobic silane, nonpolar polymer, silazane, polysilsesquioxane, and fluorocarbon.

4. The method of claim 1, wherein the functional layer is a hydrophilic layer.

5. The method of claim 4, wherein the hydrophilic layer is selected from the group consisting of: hydrophilic silane, polar polymer, polyethylene glycol, polyethylene oxide, and proteins.

6. The method of claim 1, wherein said functional layer comprises a material that may be deposited in a liquid phase and transition to a solid phase following deposition.

7. The method of claim 1, wherein said first and second wall structures are deposited in a liquid phase and transition to a solid phase following deposition.

8. The method of claim 7, wherein said first and second wall structures each comprise a wax material.

9. The method of claim 1, wherein said first and second wall structures are deposited to be substantially thicker than said source and drain electrodes.

10. The method of claim 1, wherein said first and second wall structures are deposited with a thickness in a range between 0.5 microns and 5.0 microns above a surface of the functional layer.

11. The method of claim 1, wherein the well region has a width in the range between 10 microns and 500 microns.

12. The method of claim 1, wherein the semiconductor layer comprises a material that is deposited in a liquid phase and transitions to a solid phase following deposition.

13. The method of claim 1, wherein the semiconductor layer includes precursors selected from the group consisting of: pentacene; zinc oxide; silicon; carbon nanotubes; silicon nanowires; silicon nano-belts; grapheme; silicon nano particles; silicon nano-rods; and silicon nano-ribbons.

* * * * *